(12) United States Patent
Mehuys et al.

(10) Patent No.: US 7,167,490 B2
(45) Date of Patent: Jan. 23, 2007

(54) OPTICAL GAIN APPARATUS WITH PUMP SOURCE WAVELENGTH CONTROL

(75) Inventors: David G. Mehuys, Sunnyvale, CA (US); Richard R. Craig, Palo Alto, CA (US); Jay A. Skidmore, San Jose, CA (US); Vincent V. Wong, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 281 days.

(21) Appl. No.: 10/795,925

(22) Filed: Mar. 8, 2004

(65) Prior Publication Data

US 2004/0207913 A1    Oct. 21, 2004

Related U.S. Application Data

(63) Continuation-in-part of application No. 10/007,381, filed on Nov. 5, 2001, now abandoned.

(51) Int. Cl.
    *H01S 3/10* (2006.01)
(52) U.S. Cl. ............................ 372/23; 372/102; 372/96
(58) Field of Classification Search .................. 372/23, 372/43.01, 50.11, 102
See application file for complete search history.

(56) References Cited

U.S. PATENT DOCUMENTS 5,305,335 A * 4/1994 Ball et al. ........................ 372/6
5,471,490 A 11/1995 Liedenbaum et al. ......... 372/32
5,506,724 A 4/1996 Shimizu et al. ............. 359/341
5,666,372 A * 9/1997 Ball et al. ........................ 372/6

(Continued)

OTHER PUBLICATIONS

Dudley et al., Temperature dependence of the properties of DBR mirrors used in surface normal optoelectronic devices:, IEEE Journal of Photonics Technology Letters, vol. 4, No. 4, pp. 314-314, Apr. 1992.
Liu et al., "Tuning characteristics of monolithic passively mode-locked distributed Bragg reflector semiconductor lasers", IEEE Journal of Quantum Electronics, vol. 32, No. 11, pp. 1965-1975, Nov. 1996.

*Primary Examiner*—Minsun Oh Harvey
*Assistant Examiner*—Delma R Flores Ruiz
(74) *Attorney, Agent, or Firm*—Allen, Dyer, Doppelt, Milbrath & Gilchrist, P.A.

(57) ABSTRACT

An optical fiber laser has an output that is stabilized to adapt to changes in laser operating temperature. At the output of the laser a plurality of wavelength-selective stabilizing reflectors is provided, each having a reflectivity profile with a different center wavelength. The reflectors, typically Bragg gratings, have a relative degree of reflectivity and relative wavelength separation that results in the output power of the laser being at one or more of the reflector center wavelengths throughout the temperature change. Thus, as a temperature shift causes the wavelength of the optical energy generated in the laser gain medium to change, the grating-stabilized output of the laser shifts between one locked wavelength and another. However, the output remains stable over the extended wavelength range provided by the multiple reflectors. Such a laser is particularly useful in an amplifier system in which the laser is used as an optical pump source.

5 Claims, 13 Drawing Sheets

U.S. PATENT DOCUMENTS

| | | | |
|---|---|---|---|
| 5,691,989 A | 11/1997 | Rakuljic et al. | 372/20 |
| 5,796,764 A * | 8/1998 | Corsini et al. | 372/6 |
| 5,914,972 A | 6/1999 | Siala et al. | 372/33 |
| 6,038,357 A | 3/2000 | Pan | 385/24 |
| 6,041,070 A * | 3/2000 | Koch et al. | 372/6 |
| 6,185,230 B1 * | 2/2001 | Waarts | 372/6 |
| 6,295,304 B1 * | 9/2001 | Koch et al. | 372/6 |
| 2003/0002050 A1 * | 1/2003 | Tatsuno et al. | 356/519 |

\* cited by examiner

OPTICAL GAIN APPARATUS WITH PUMP SOURCE WAVELENGTH CONTROL

CROSS-REFERENCE TO RELATED APPLICATIONS

This application is a continuation-in-part of U.S. patent application Ser. No. 10/007,381 filed Nov. 5, 2001 now abandoned, which is incorporated herein by reference for all purposes.

FIELD OF THE INVENTION

The present invention related to optical communications, and more particularly to pump lasers for pumping optical amplifiers in an optical communications network.

BACKGROUND OF THE INVENTION

Optical fiber amplifiers, such as erbium-doped amplifiers and Raman amplifiers, are commonly used for amplifying optical signals transmitted long distances over optical fibers. However, as dense wavelength division multiplexed (DWDM) transmitters and receivers become more complex, with increased numbers of routing and switching elements in the optical layer, the increased losses within the DWDM transmitters and receivers demand that amplification also be provided within the DWDM transmitters and receivers themselves.

The requirements of the optical amplifiers used within DWDM transmitters and receivers are different from those of the optical amplifiers used for long-haul transmission. The optical amplifiers may be used on single channels or on bands of channels, depending on whether they are used before or after multiplexing components in the DWDM transmitter or before or after demultiplexing components in the DWDM receiver. Therefore, gain flattening filters may not be required. Also, the gain required from an amplification stage may be only a few dB, significantly less than the gain usually required of a long-haul amplifier. On the other hand, due to the large number of channels, the potentially large number of amplifier elements in a transmitter or receiver drives the need for low cost, compact size, reduced power consumption and ruggedness. Reductions in size, cost and power consumption dictate the use of simple packaging, hybrized components that may require removal of thermal electric coolers. In particular, pump laser, fiber coupling, isolator and gain fiber cost should be minimized.

SUMMARY OF THE INVENTION

In accordance with the present invention, a laser system is provided that includes a laser having an output the wavelength of which changes with a change in operating conditions. At the output of the laser are located a plurality of wavelength-selective stabilizing reflectors. These reflectors are each partially reflective and provide feedback to the laser, but each has a reflectivity profile with a different center wavelength. Indeed, a degree of reflectivity of each of the reflectors and a relative wavelength separation between them is such that a wavelength lock of the laser transitions between the reflector center wavelengths as the operating temperature changes. This provides output stability over a wider range than prior art lasers having a single stabilizing grating having a single reflectivity peak such as the system disclosed by Rakuljic et al in U.S. Pat. No. 5,691,989. In FIG. 19 of the '989 patent a plurality of single reflectors 77a through 77n each having different single reflectivity peak are used in combination with a thermoelectric cooler to stabilize n laser signals. One signal is incident upon a single filter having a single reflectivity peak. This solution is not preferred for coolerless lasers. This instant invention may use, but does not require a cooler since two separate reflectivity peaks within the operating wavelength of the laser provide wavelength stabilization in the absence of a cooler. These reflectors are preferably fiber Bragg gratings, but may also be other types of partial reflectors such as dielectric coatings on an output facet of the laser.

With the use of multiple stabilizing reflectors or one reflecting filter with two separate spaced reflectivity peaks, the laser is always locked to one or more of the two wavelengths. Therefore, if the wavelength of light being generated by the laser element begins to drift due to a change in operating temperature, the laser will remain wavelength-locked to one or more of the reflectors or peaks. As the wavelength of the optical energy generated by the laser shifts, the reflectivity profile of one of the other reflectors is more closely matched with the generated optical energy, resulting in the feedback lock of the laser shifting more to this new wavelength range. As such, the output of the laser begins to be dominated by the wavelength of this other reflector. Thus, while the dominating output wavelength of the laser shifts between wavelengths fed back by the reflectors, it remains limited to the range spanned by the reflectors, thereby providing a relatively wide range of stability.

Preferably, there are only two output reflectors, and they are positioned in wavelength on either side of, and substantially equidistant from, a peak absorption wavelength of a gain medium being pumped by the laser. Thus, if the reflectors have the same degree of partial reflectivity, the relative absorption of the gain medium for the two reflector wavelengths is approximately equal. This gives roughly the same pulling range to each of the gratings for the purposes of wavelength lock. Moreover, the reflector wavelengths are close enough to each other relative to their degree of reflectivity such that, as the output of the laser medium shifts with temperature, positive lock to one or both of the output reflectors is ensured.

Because it adapts to the thermal wavelength shifting of the laser, the present invention allows for a stable laser output without the use of active cooling to precisely maintain the operating temperature of the laser. This laser apparatus is particularly useful for systems in which the output wavelength of the apparatus can be one of a number of different wavelengths within a given range, such as in the pumping of amplifiers for certain wavelength division multiplexed communication systems. The pump may be used in a transmitter module or in a receiver module, amplifying either the multiplexed or demultiplexed signals for either. It may also be used in conjunction with a pump controller that controls the operation of the laser in response to signals detected at the amplifier output and/or input with monitor photodiodes.

For other applications, such as solid-state laser (SSL) or dual-clad fiber laser (DCFL) pumping, the same concept may be applied to other optical feedback elements containing a Bragg grating. For example, volumetric-holographic gratings could be used in the former case, for example, to spectrally lock diode bars having multiple emitters, whereas gratings suitable for multi-mode fiber could be utilized for pumping DCFLs. If the laser host medium has multiple absorption peaks (e.g., Nd or Yb:YAG) in close wavelength proximity, then contrary to the previous example, it would be desirable to center the diode gain emission between two absorption peaks of the laser host, so as to maintain a high and invariant pump absorption level, even if the diode gain drifts between those two peaks over temperature range.

BRIEF DESCRIPTION OF THE DRAWINGS

The above and further advantages of the invention may be better understood by referring to the following description in conjunction with the accompanying drawings in which.

DETAILED DESCRIPTION

The amplifiers used in WDM transmitter or receiver heads typically are less demanding than amplifiers used in long haul transmission. Long haul transmission typically requires amplifiers that have high gain, high output power, and flat gain profile over a wide bandwidth. This level of performance requires a pump laser that must meet demanding requirements. In contrast, optical amplifiers used in WDM transmitter or receiver heads are less demanding, and typically require gains of 10–15 dB or less, output powers of 0–10 dBm, noise figures of 5–10 dB and gain flatness of 1–5 dB. Typically, less than 50 mW of pigtailed pump power is required. The type of amplifier used in a WDM transmitter or receiver is typically an erbium-doped fiber amplifier (EDFA), although other types of amplifiers may also be used. The modest pump power requirements result in the demands on the pump laser being reduced relative to those for long haul transmission. Accordingly, the robustness of the pump laser packaging may be traded for other characteristics, such as simplicity or cost.

The present invention is directed to pump lasers that are low cost, compact, rugged, and provided in simple packaging, for pumping amplifiers that are typically located in WDM transmitter or receiver heads. An important feature of a pump laser used in a WDM transmitter or receiver is the ability to operate with modest pump power over an extended temperature range, for example a case temperature in the range 0°–75° C.

Significant advantages in cost reduction and packaging simplicity may be achieved by using a laser that has no active cooling, that is, that has no thermo-electric cooler to maintain the laser at a selected operating temperature. The wavelength of such a laser may change with operating temperature, but the relaxed requirements of pumping low-power amplifiers in WDM transmitters and receivers permit some variation in wavelength without adversely affecting amplifier operation.

Figure 1:
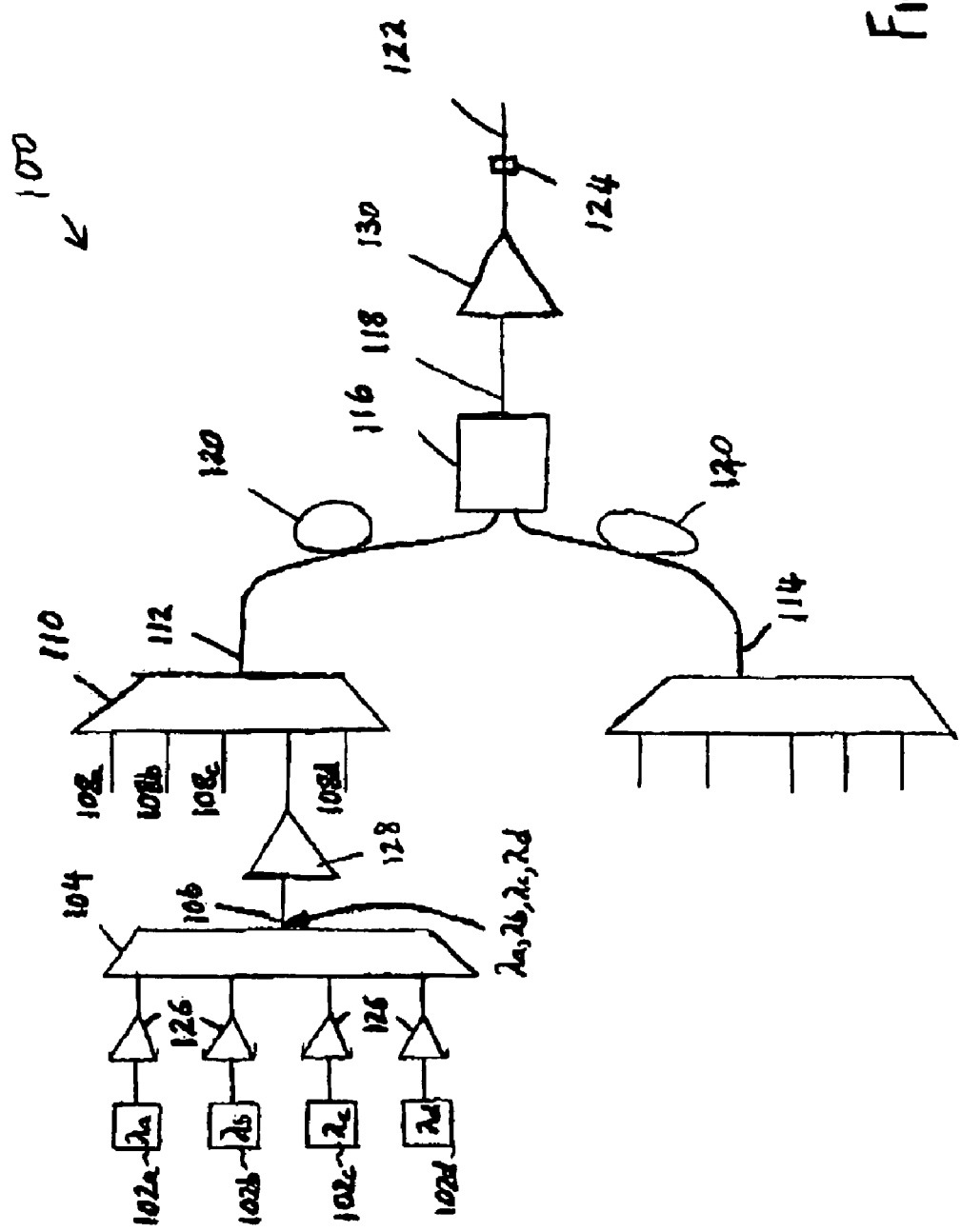
FIG. 1 schematically illustrates an embodiment of a wavelength division multiplexed (WDM) optical transmitter according to the present invention.

An embodiment of a WDM transmitter 100 is illustrated in FIG. 1, showing multiple levels of multiplexing and amplification in a 40-channel transmitter. A number of light sources 102a, 102b, 102c and 102d, such as single mode, tunable semiconductor lasers, generate light at different wavelengths $\lambda_a$, $\lambda_b$, $\lambda_c$ and $\lambda_d$, respectively. The light from the light sources 102a, 102b, 102c and 102d is combined in a WDM multiplexing element 104 to produce a four channel multiplexed signal 106 that includes the wavelengths $\lambda_a$, $\lambda_b$, $\lambda_c$ and $\lambda_d$. The output from other light sources, not shown, may similarly be mixed to produce other four-channel signals 108a, 108b, 108c and 108d. The four-channel signals 106 and 108a, 108b, 108c and 108d are combined in a second WDM multiplexing element 110 to produce a twenty-channel signal 112 which is combined with another twenty channel signal 114 in an interleaver 116 to produce a dense WDM (DWDM) forty-channel signal 118.

The transmitter 100 may include a dispersion-compensating element 120 to compensate the dispersion experienced by the signal passing along the transmission fiber 122. The dispersion-compensating element 120 may be provided between the second multiplexing element 110 and the interleaver 116, as illustrated, or may be positioned elsewhere, for example between the first and second WDM multiplexing elements 104 and 110.

The transmitter 100 may also include amplifiers at various stages between the light sources 102a–102d and the output 124. For example, amplifiers 126 may be positioned between the light sources 102a–102d and the first multiplexing element 104. There may also be an amplifier 128 disposed between the first and second multiplexing elements 104 and 110. Similarly, there may be an amplifier 130 disposed after the interleaver 116. Amplifiers may be positioned elsewhere in the transmitter 100, for example between the second multiplexing element 110 and the interleaver 116.

It will be appreciated that this embodiment is provided to illustrate a WDM transmitter, and that other configurations may be used. For example, the signals from five light sources may be multiplexed together to produce a five-channel signal, and then four five-channel signals multiplexed together to produce a twenty-channel signal. Furthermore, the transmitter 100 need not produce a forty channel signal, but may produce some other numbers of channels, for example twenty or eighty.

Figure 2:
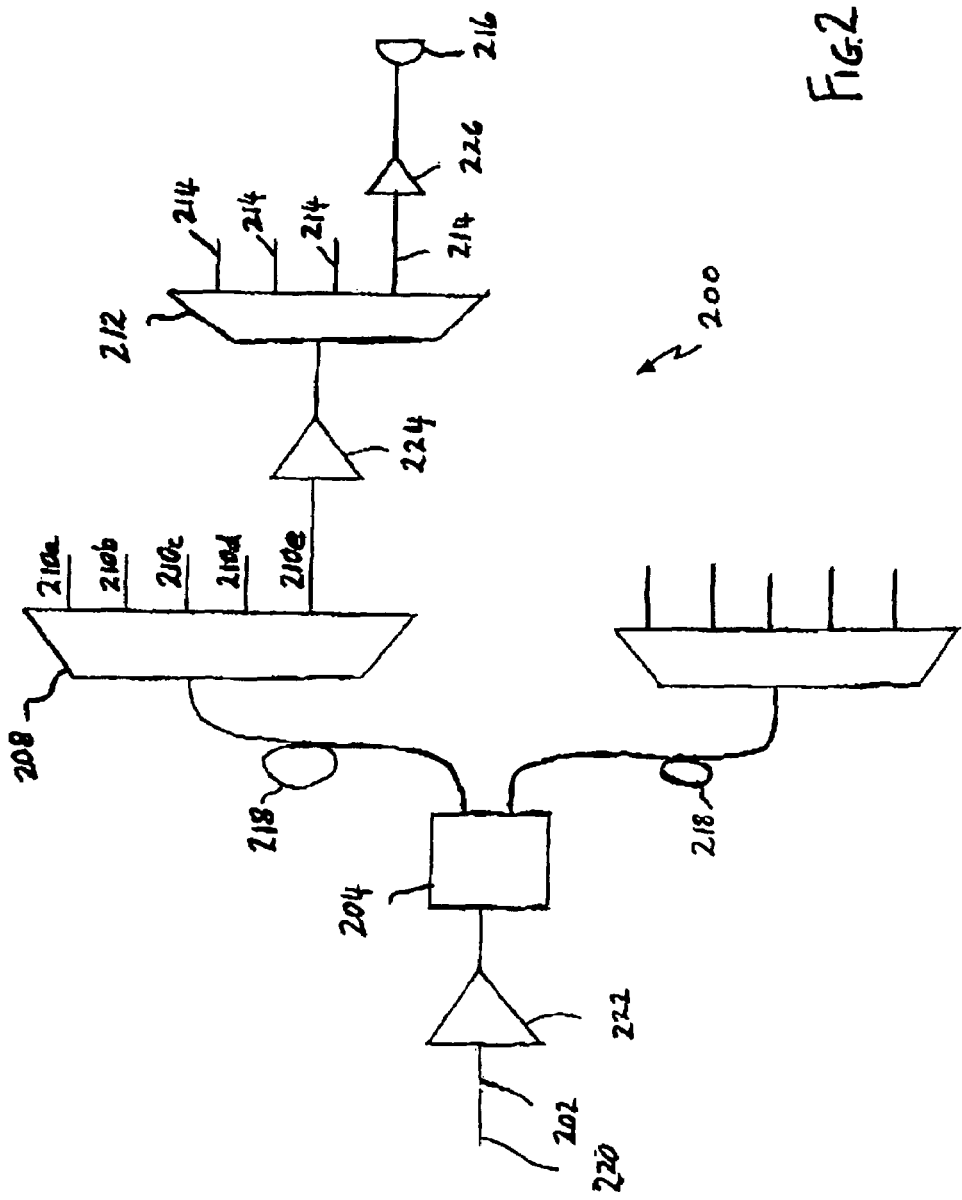
FIG. 2 schematically illustrates an embodiment of a wavelength division multiplexed (WDM) optical receiver according to the present invention.

An embodiment of a WDM receiver 200 is illustrated in FIG. 2, showing multiple levels of demultiplexing and amplification in a forty-channel receiver. A WDM signal is received through an input 202 and is directed to a de-interleaver 204, which de-interleaves the incoming WDM signal into two signals. Thus, if the incoming signal contains forty channels, the de-interleaver produces two de-interleaved signals of twenty channels each. One of the de-interleaved signals is directed to a first demultiplexer 208, which splits the twenty channels among five four-channel outputs 210a, 210b, 210c, 210d and 210e. Each four-channel output 210a, 210b, 210c, 210d and 210e is directed through a second demultiplexer 212 to separate the channels into individual channels on paths 214, each of which is from there directed to its own individual detector 216. Only one second demultiplexer 212 and one detector 216 are illustrated to maintain clarity.

The receiver 200 may include a dispersion-compensating element 218 to compensate the dispersion experienced by the signal passing along the transmission fiber 220. The dispersion compensating element 218 may be provided between the de-interleaver 204 and the first demultiplexing element 208, as illustrated, or may be positioned elsewhere, for example between the first and second demultiplexing elements 208 and 212.

The receiver 200 may also include amplifiers at various stages between the input 202 and the detectors 216. For example, an amplifier 222 may be positioned between the input 202 and the de-interleaver 204. Amplifiers 224 may also be disposed between the first and second demultiplexing elements 208 and 212. Furthermore, there may also be amplifiers 226 disposed between the second demultiplexer 212 and detectors 216. Amplifiers may be positioned elsewhere in the receiver 200, for example between the de-interleaver 204 and the first demultiplexing element 208.

It will be appreciated that this embodiment is provided only to illustrate a WDM receiver, and that other configurations may be used. For example, the twenty-channel signal 207 may be demultiplexed into four five-channel signals, and then four five-channel signals are each further demultiplexed to produce individual channel signals. Furthermore, the receiver 200 need not receive only a forty channel signal, but may receive some other numbers of channels, for example twenty or eighty.

Figure 3:
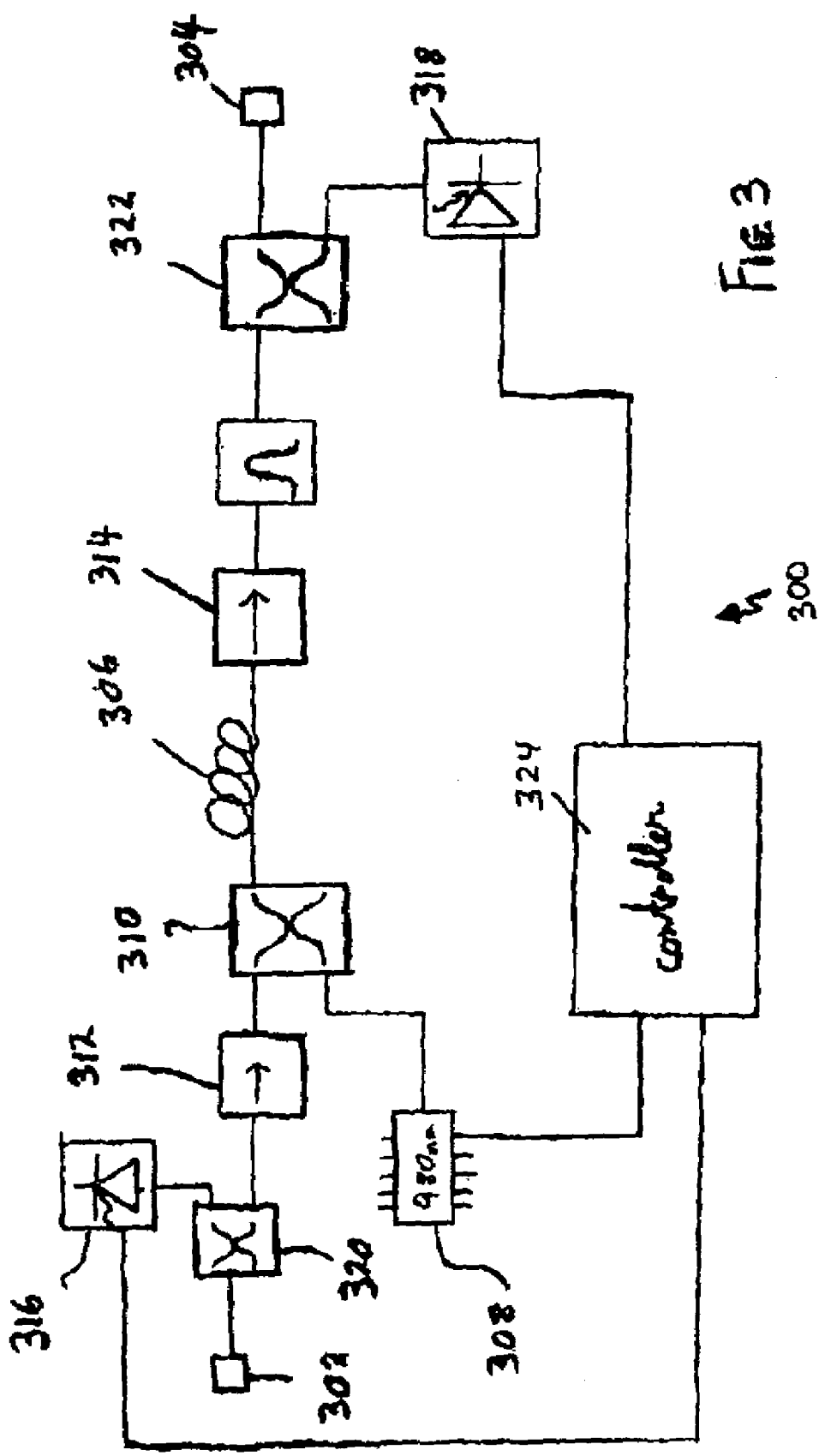
FIG. 3 schematically illustrates an optical amplifier according to the present invention.

An embodiment of a fiber amplifier unit 300 is illustrated in FIG. 3. The amplifier unit 300 includes an input port 302 and an output port 304. A fiber amplifier 306 is disposed between the input port 302 and output port 304. A pump laser 308 directs pump light through a coupler 310 to the fiber amplifier 306. Where the fiber amplifier 306 is a rare earth-doped fiber amplifier, such as an erbium doped amplifier or an yttrium/erbium doped amplifier, the pump wavelength may be, for example, approximately 980 nm.

Isolators 312 and 314, placed on either side of the fiber amplifier 306, prevent signals from propagating backwards through the system. The amplifier 300 may also be provided with input and output monitor photodiodes 316 and 318, coupled via respective couplers 320 and 322, for monitoring the strength of input and output optical signals to and from the amplifier unit 300. The photodiodes 316 and 318 may be connected to a controller 324 that senses the gain in the amplifier unit 300 and controls the pump laser 308 to adjust the gain to a desired level, or to produce a given output power level.

An important feature of the invention is that the pump laser operates with a modest power budget over an extended temperature range, at least 0°–75° C. One way of achieving this is to use a coolerless pump laser module, in other words, a pump module that does not include any active cooling. The omission of active cooling makes the pump module smaller and less expensive, since the active cooling elements, such as a thermo-electric cooler, temperature sensor and temperature control circuitry, are avoided.

One consequence of omitting active cooling from the pump laser module is that the operating temperature of the semiconductor laser is not stabilized. Ordinarily, such instability would be a problem. However, when pumping small amplifiers within WDM transmitters or WDM receivers, the pump laser operating requirements can be more relaxed as compared to the pump requirements for long haul applications, where optimized performance is critical. Consequently, it is acceptable to have some degree of variation in the operation of the pump laser over a range of temperatures. For example, the absorption band of an EDFA at around 1480 nm is relatively flat, and so the temperature-induced wavelength variation in a semiconductor pump laser operating at about 1480 nm is relatively inconsequential. As such, a 1480 nm pump laser is an example of a pump source that might be used to pump an amplifier in a WDM transmitter or receiver without the benefit of a cooling system.

Figure 4:
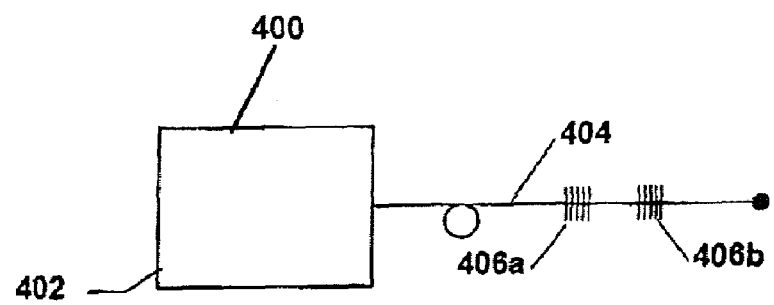
FIG. 4 schematically illustrates an embodiment of a grating stabilized semiconductor laser, using a multiple grating fiber, according to the present invention.

One particular embodiment of a laser that may be implemented in a coolerless pump module is illustrated in FIG. 4. The laser 400 includes a semiconductor laser element 402 whose output is coupled to an output fiber 404. The output fiber 404 may be coupled to a fiber amplifier. The output fiber 404 includes two fiber Bragg gratings (FBGs) 406a and 406b that have respective reflectivity spectra centered around respective center wavelengths $\lambda_1$ and $\lambda_2$. The FBGs feed a portion of the output light back to the semiconductor laser element to lock the operation wavelength over a certain temperature range. In the laser of FIG. 4, the gain of the laser element 402 changes with operating temperature, and the wavelength peak of the gain shifts at a rate of approximately 0.3 nm/° C. Thus, if the gain of the semiconductor laser element 402 is centered at about 970 nm when the operating temperature is 0° C., the gain peak is shifted to about 977.5 nm at an operating temperature of 25° C. and to 985 nm at an operating temperature of 50° C.

As an example, the set of FBGs 406a and 406b may have reflectivities centered at approximately 971 nm and 984 nm, respectively. However, it will be appreciated that the FBGs might easily be centered at different wavelengths. The following description explains the operation of the invention given the example gratings 406a and 406b.

As the temperature of the laser element 402 increases from 0° C., its peak gain shifts upwards in wavelength but, because the laser's operating wavelength is locked by feedback from the FBG centered at 971 nm, the operational wavelength of the laser does not shift. The output power at the 971 nm wavelength, however, goes down, since less overall energy is generated in the pump module 402 at 970 nm. As the operating temperature continues to increase, the amount of optical energy generated by the pump module at 984 nm begins to exceed that generated at 971 nm. The dominant output from the source gradually shifts to 984 nm. The external feedback provided by grating 406b therefore begins to dominate. Thus, over the operating range of 0° C.–75° C., the laser 400 essentially operates at two different wavelengths, 971 nm and 984 nm.

From the description herein, those skilled in the art will recognize that the grating reflectivities of the present invention are separated relatively far in wavelength, such as to cause two distinct feedback peaks separated by a wavelength region of low power. The predominant wavelength content of the output power transitions from the wavelength peak of one of the gratings to that of another as the temperature changes, while wavelengths between the two reflectivity peaks register very little feedback and absorption by the gain medium. This is due partly to the degree of wavelength separation between the reflectivity peaks, and partly to the degree of reflectivity of the gratings and the narrowness of the reflectivity peaks. Moreover, in the preferred embodiment, the gratings have reflectivities positioned to either side of a gain curve of a gain medium being pumped. In particular, each of the grating reflectivities is positioned at a point on the gain curve having the same gain value (albeit on opposite slopes of the curve). Thus, as the feedback contribution shifts from one grating to the other, the overall amplifier gain remains roughly the same.

Figure 5A:
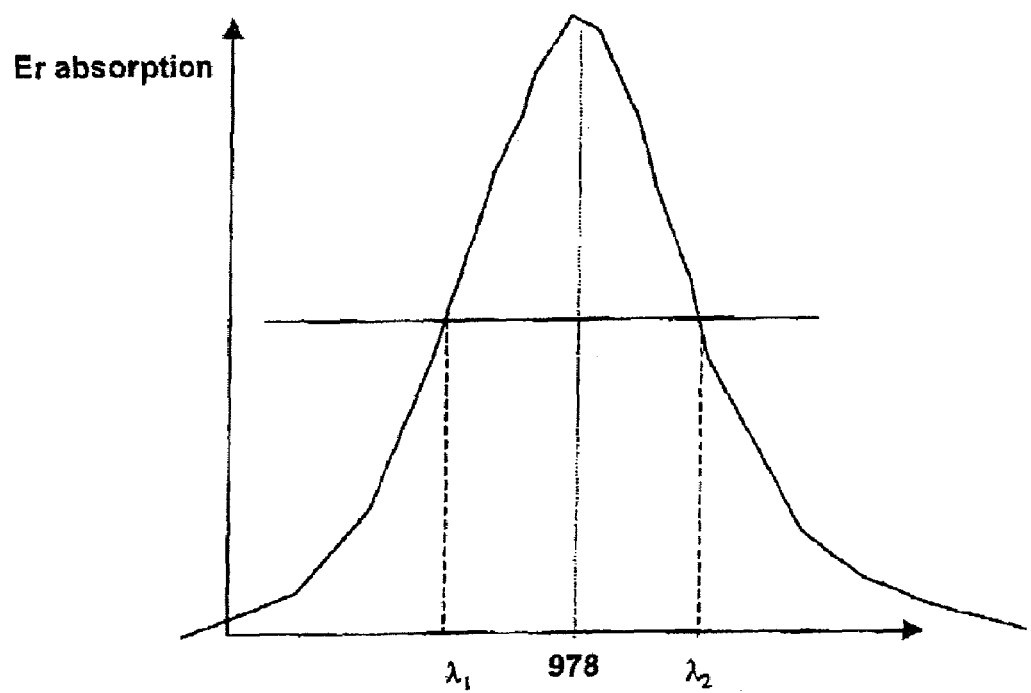
FIG. 5A is a graphical illustration of the absorption of an erbium-doped gain fiber versus wavelength.

The set of FBGs 406a and 406b are described as having respective reflectivities centered at approximately 971 nm and approximately 984 nm. However, it will be appreciated that the reflectivities of the FBGs might be centered at different wavelengths, and that there may be more than two gratings, each at a different wavelength. However, the preferred embodiment of using these two wavelengths is appropriate for the specific example being discussed. This, in part, has to do with the specific gain material being used. In this example, the laser element 402 is being used to pump an erbium doped gain medium. Such a gain medium has a particular wavelength absorption characteristic, which is shown in FIG. 5A. As shown, the absorption spectrum has a peak at approximately 978 nm, and tapers off to either side of this center wavelength. In the present embodiment, the two gratings 406a and 406b have reflectivity peaks that are equidistant from the peak of the erbium absorption spectrum, in this case at about 971 nm and 984 nm. If the pump module contains two gratings at the wavelengths shown, then equal absorption (and roughly equal gain) in the gain medium will occur regardless of whether the laser emits at one or the other of the wavelengths, or at both.

Figure 5B:
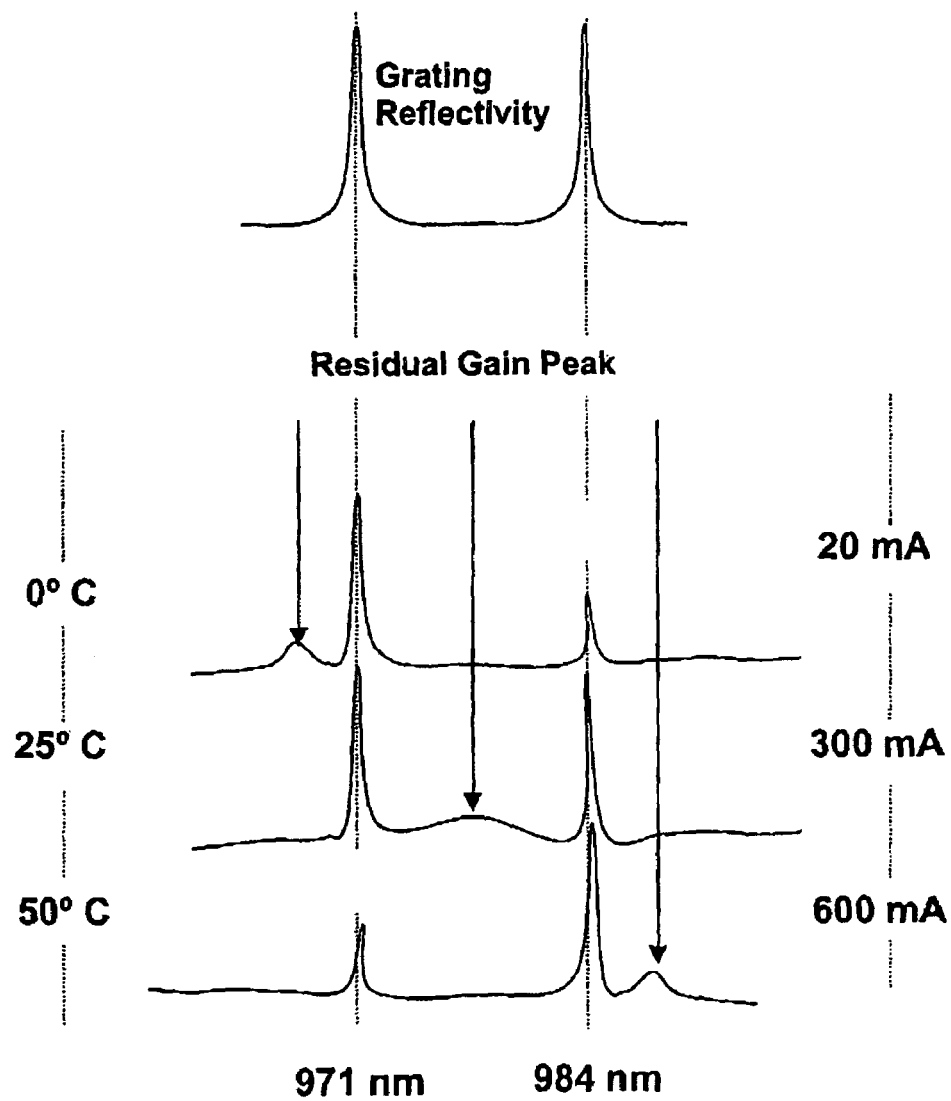
FIG. 5B is a graphical illustration of the wavelength emission of an example laser showing the shifting output at different operating temperatures.

The difference in operation of the laser at certain different temperatures and currents is shown in FIG. 5B. At the top of the figure, the grating reflectivity is shown, while the corresponding output spectra are illustrated below for a two-grating stabilized module at different temperatures and source currents. In this case, the reflectivity of the gratings is sufficiently high that most of the output power is constrained to one or both of these grating wavelengths, as indicated by the small residual gain peak, the wavelength of which increases with temperature. As shown, at a temperature of 0° C. and a current of 20 mA, the output is dominated by the 971 nm peak. As the temperature of the laser element 402 increases from 0° C., its peak gain increases in wavelength but, because the laser's operating wavelength is locked by feedback from the FBG centered at 971 nm, the operational wavelength of the laser does not change. The output power at the 971 nm wavelength, however, goes down, since less overall energy is generated in the pump module 402 at 971 nm. As the operating temperature continues to increase, the amount of optical energy generated by the laser medium in the vicinity of 984 nm approaches and then eventually exceeds that generated in the vicinity of 970 nm. At 25° C., at a current of 300 mA, the output includes a roughly equal portion of light at both the 971 run wavelength and the 984 nm wavelength. As the temperature increases further, the external feedback provided by grating 406b then begins to dominate, and the bulk of the output is at the 984 nm wavelength. This condition is shown in the lower plot of the peak wavelengths in FIG. 5B, at a current of 600 mA. Thus, over the operating range of 0° C.–50° C., the laser 400 operates essentially at just one or both of the two wavelengths 971 nm and 984 nm.

Figure 6A:
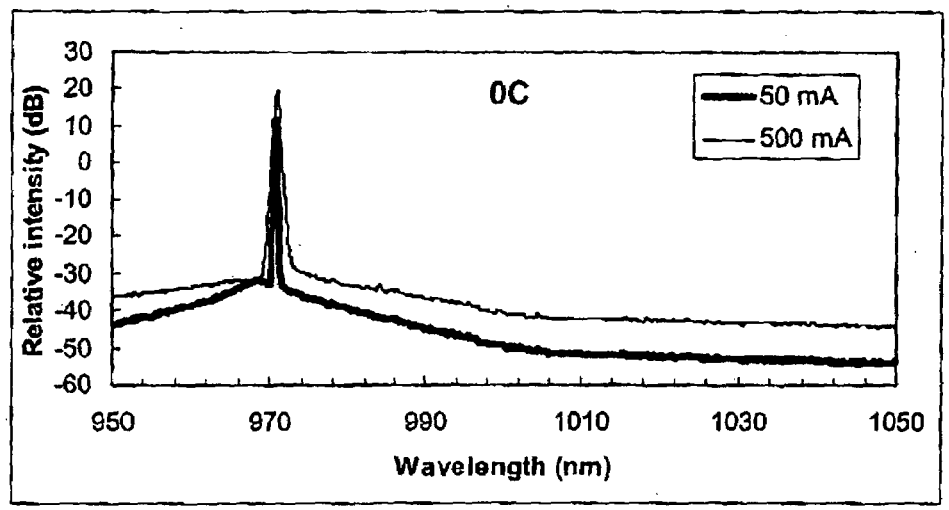
FIGS. 6A–6E are graphical illustrations showing the wavelength spectra of an example multiple grating laser element for different relative operating temperatures.
Figure 6B:
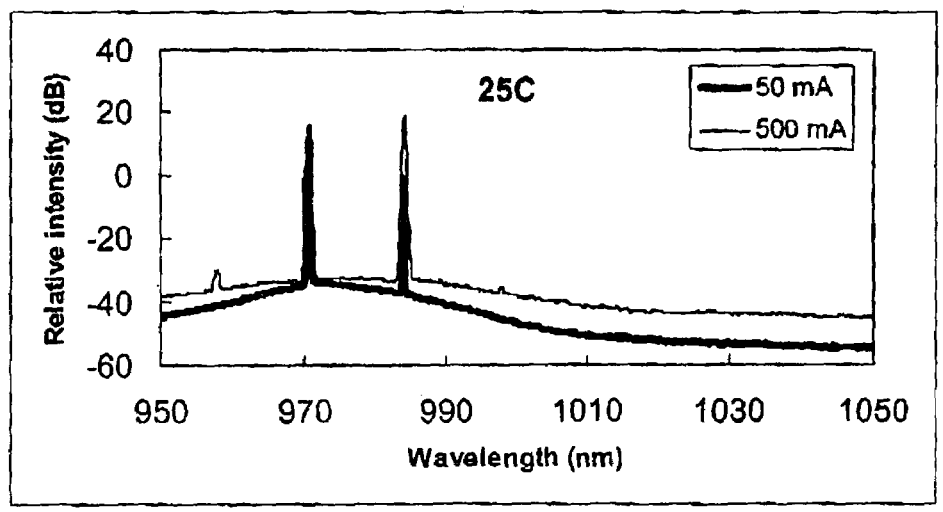
Figure 6C:
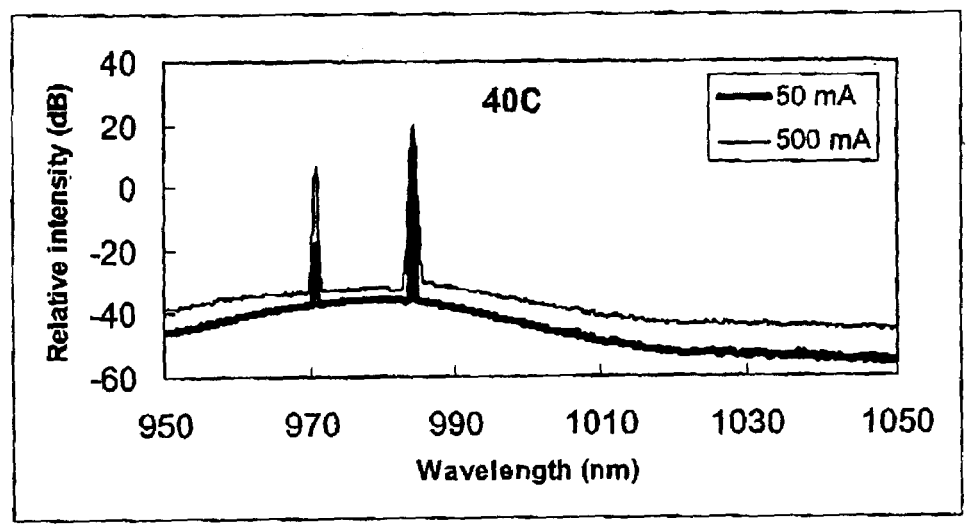
Figure 6D:
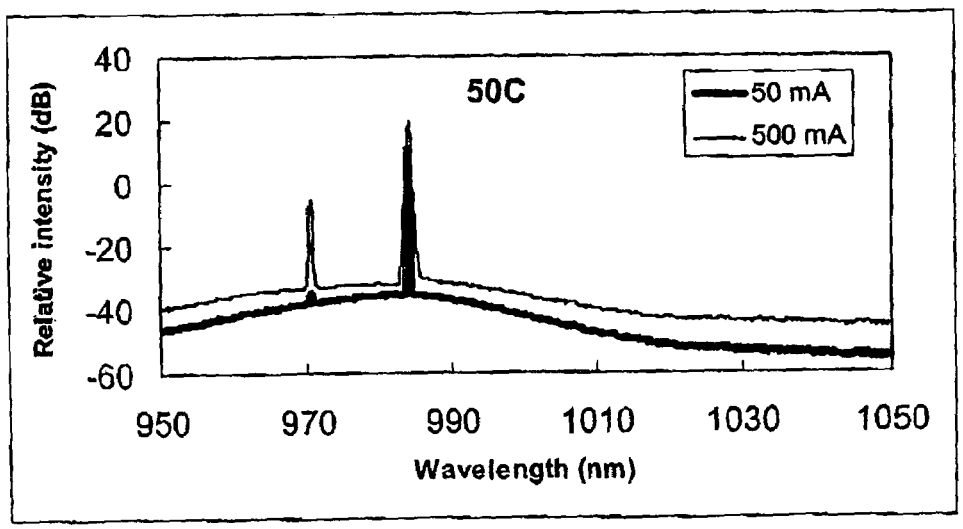
Figure 6E:
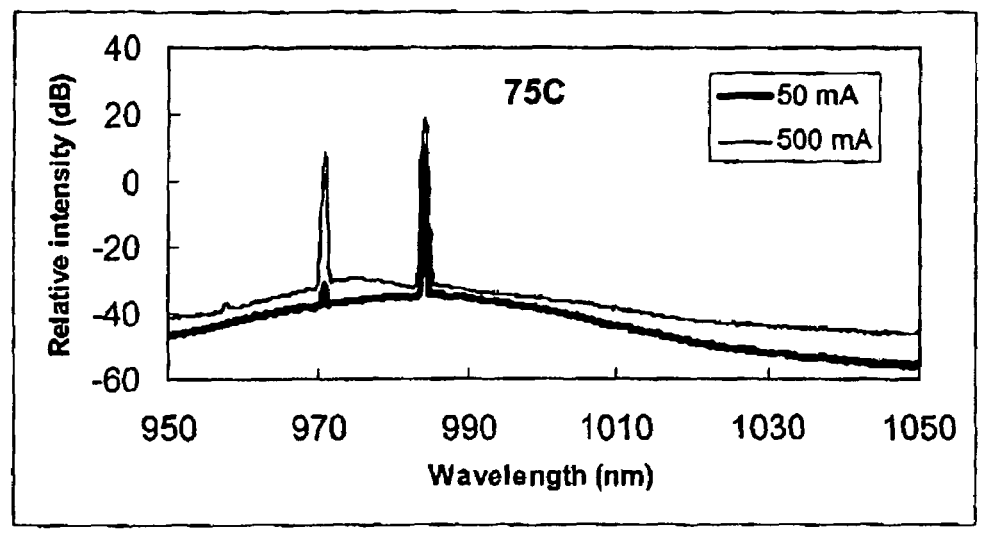
Figure 7A:
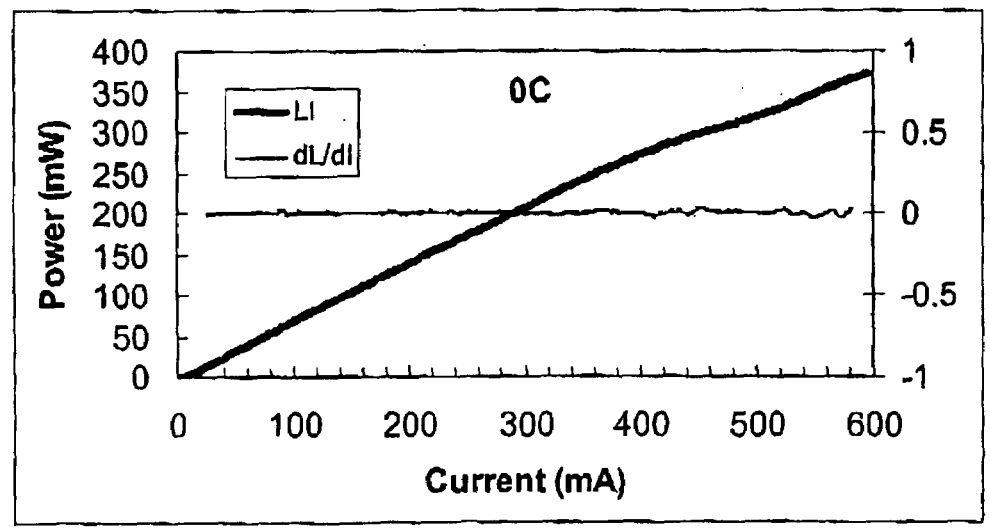
FIGS. 7A–7E are graphical illustrations showing the LI curves and corresponding dL/dI curves of an example laser element at different relative operating temperatures
Figure 7B:
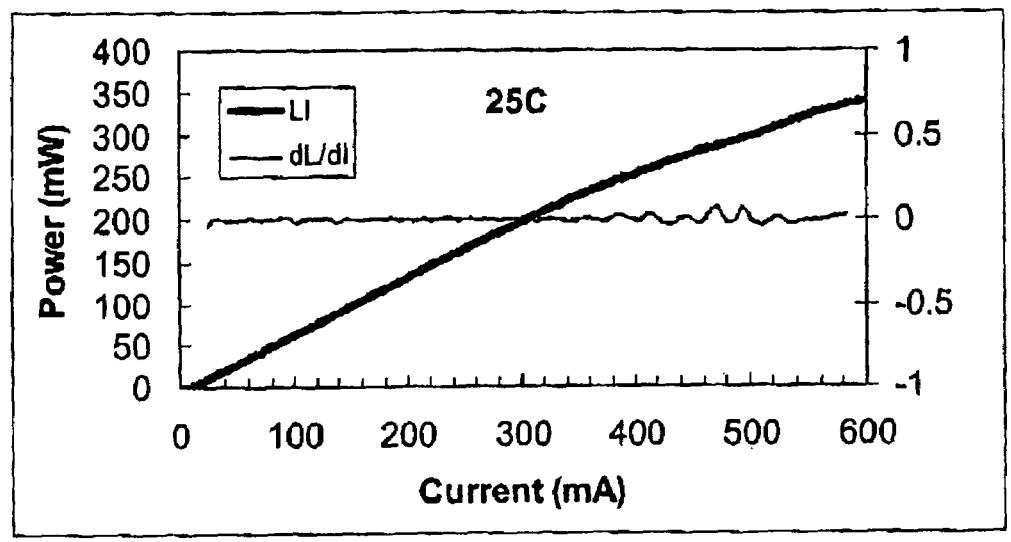
Figure 7C:
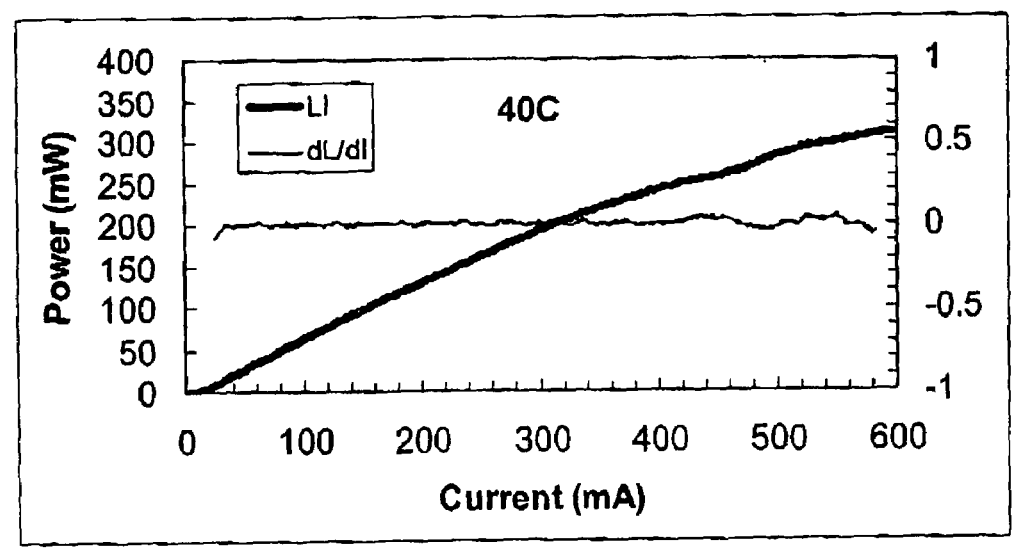
Figure 7D:
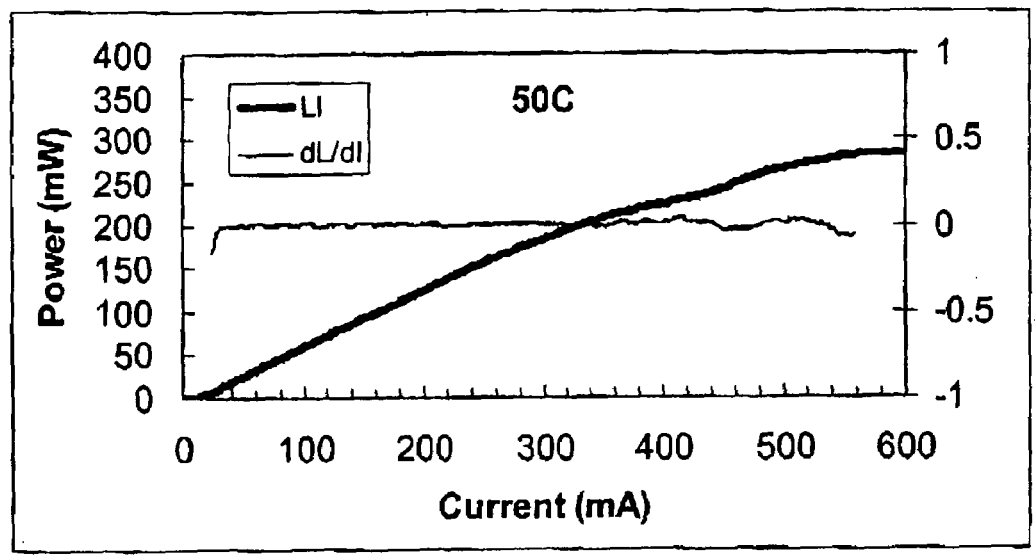
Figure 7E:
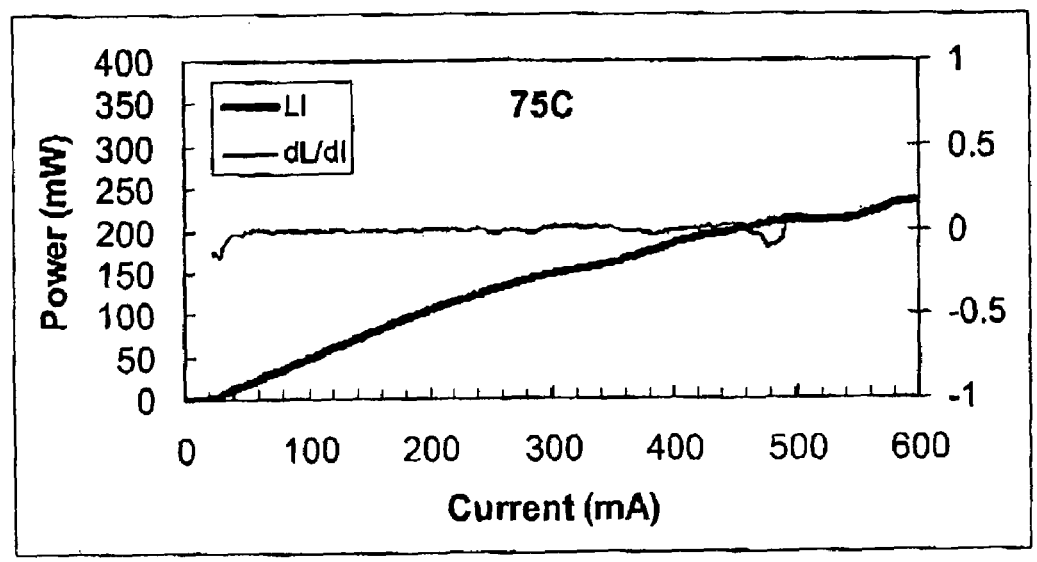
Figure 8A:
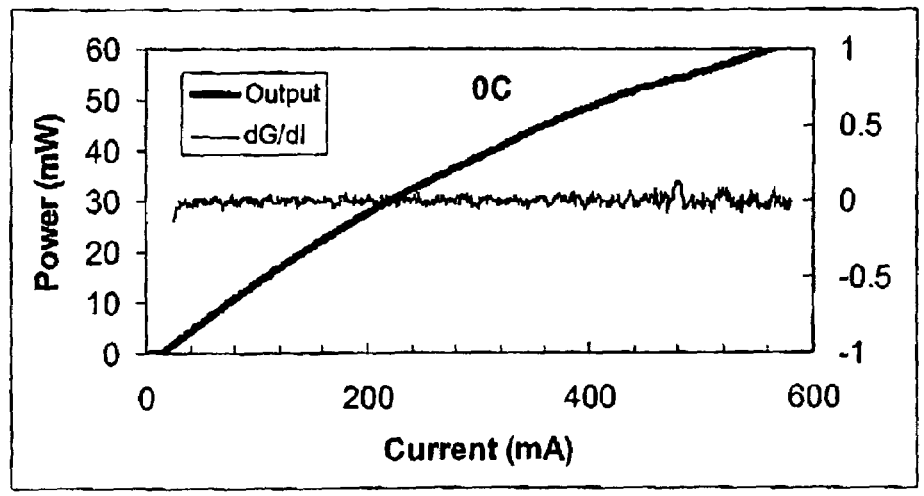
FIGS. 8A–8E are graphical illustrations showing, for different relative operating temperatures, the LI curves and corresponding dG/dI curves for an erbium-doped fiber amplifier pumped by an example laser element.
Figure 8B:
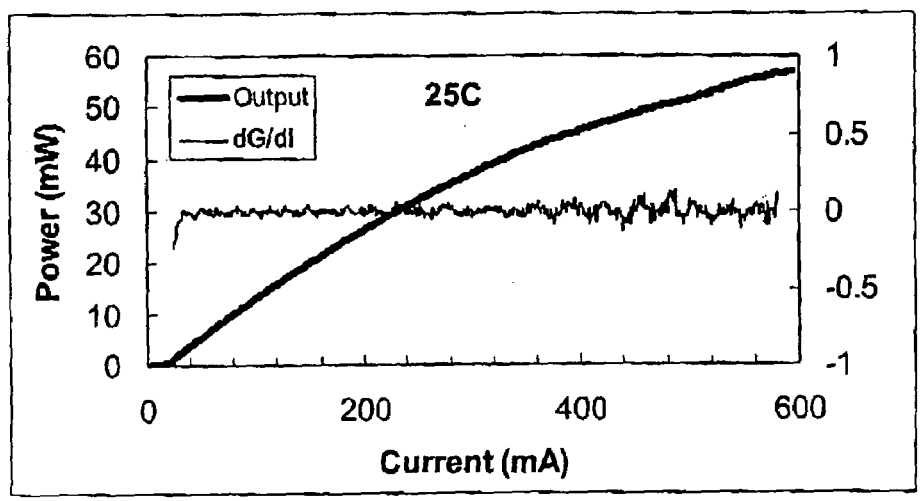
Figure 8C:
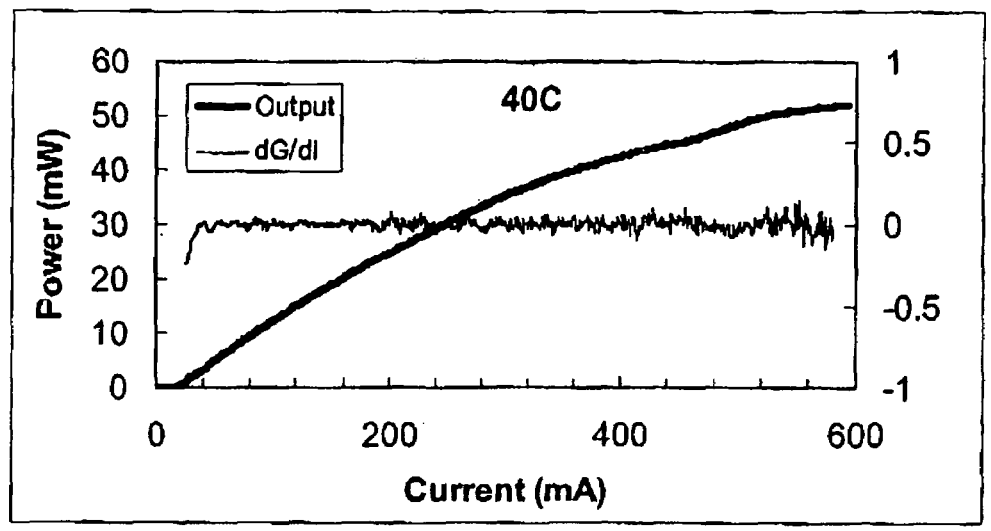
Figure 8D:
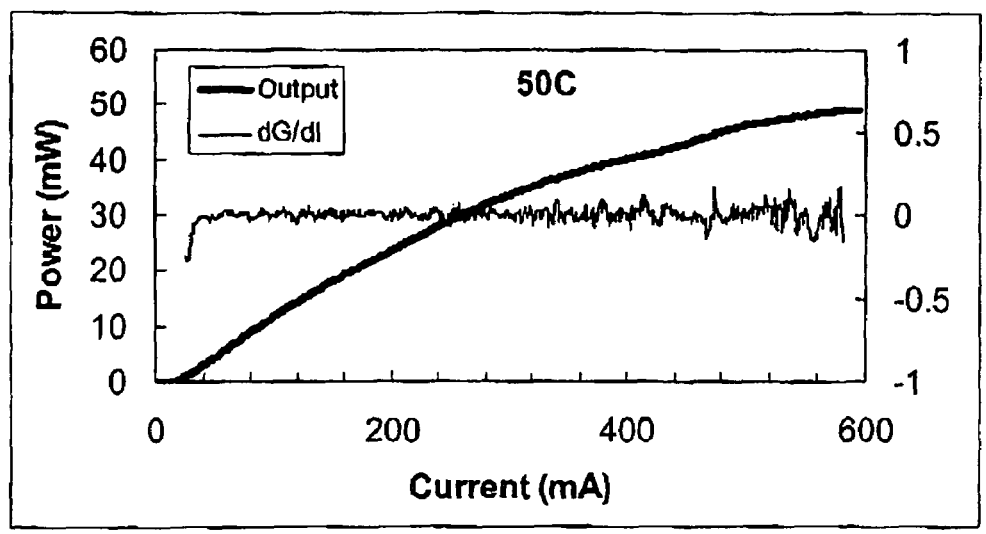
Figure 8E:
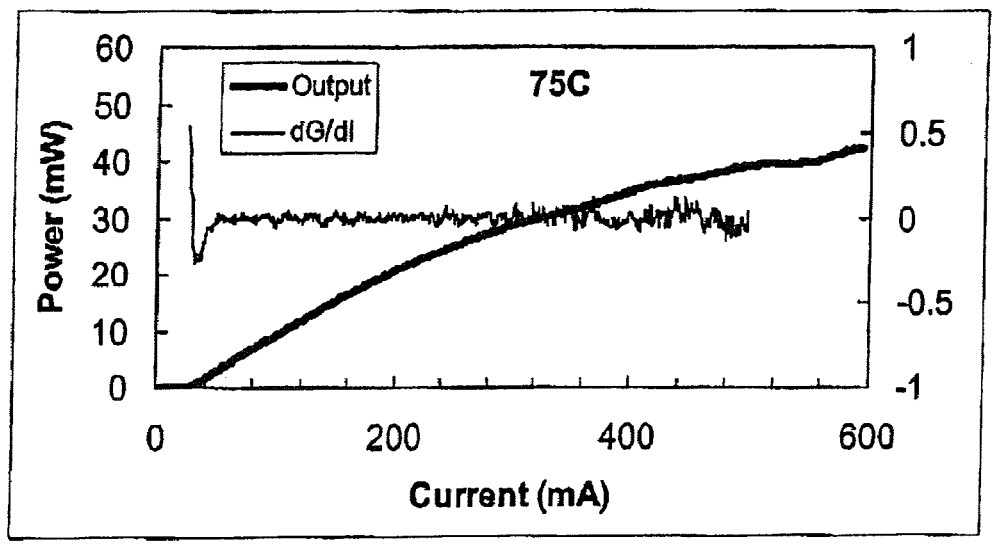

FIGS. 6A–6E show the relative intensity spectra of the energy output from the laser 402 at different respective operating temperatures. These figures represent actual data collected from a two-grating stabilized module, the gratings having a reflectivity $R_g$=6% at 971 nm and 984 nm over the full operating temperature range. For each of these figures, the spectra are shown for operation at both 50 mA and 500 mA drive currents. As shown in FIG. 6A, at 0° C., all of the output energy is concentrated at the 971 nm wavelength for both currents. FIGS. 6B–6E show that as the temperature is increased from 25° C. to 40° C. to 50° C. and finally to 75° C., the amount of output energy at the 984 nm wavelength increases and the amount at the 971 nm wavelength decreases. In the 75° C. spectra of FIG. 6E, the majority of the light at a 50 mA drive current is at 984 nm, and a majority of the light at 500 mA is at 984 nm. The fact that the figures show no significant residual gain in the spectra between the grating wavelengths indicates that the tuning range is extended effectively (approximately 13 nm) relative to a laser having a single grating with the same reflectivity.

Shown in FIGS. 7A–7E are the curves showing the light output power versus the drive current of the laser element 402 for different respective operating temperatures, so called "LI" curves. Overlaid on each of these graphs is a plot of the "slope efficiency" of the corresponding LI curve. A slope efficiency curve, as is known in the art, shows a normalized, localized derivative of the LI curve, and is used to demonstrate the relative smoothness of the LI curve. For each of the different operating temperatures from 0° to 75° C., the operation of the laser element is "kink-free." This is demonstrated by the high degree of smoothness of the slope efficiency dL/dI curves, despite the change in operating temperature and the corresponding shifting of output power between the 971 nm wavelength and the 984 nm wavelength.

FIGS. 8A–8E are similar to FIGS. 7A–7E, but show the output power versus current at different temperatures for a single-channel erbium doped fiber amplifier (EDFA) pumped by the laser element described above. This output power is based on a 1 mW input signal to the amplifier at a wavelength of 1550 nm. As shown, the LI and the slope efficiency curves (labelled "dG/dI" to distinguish from the dL/dI curves of FIGS. 7A–7E, which use the output power of the laser element itself) are very stable for the given power and temperature range. That is, kink-free operation is provided over the full range of currents and temperatures.

In order to ensure a positive wavelength lock, there is necessarily a maximum separation between the peak reflectivity wavelengths of the different FBGs. This maximum separation is based in part on the reflectivity profiles of the gratings. The stronger the reflectivity of a particular grating, the wider the wavelength range over which that grating locks to the laser output wavelength. If the wavelength peaks are too far apart, the residual gain of laser 400 may be too high at certain temperatures, resulting in unstable operation. If the gain at the different wavelengths is similar, then the amplifier provides kink-free amplification even though the laser emission may oscillate between grating wavelengths with changes in temperature or current. The presence of multiple gratings also reduces the pulling range needed by the laser element 402 to achieve stable operation. Moreover, if multiple gratings are used, the individual reflectivity of the gratings can be lower, thereby allowing greater total ex-fiber power.

The gratings of the present invention may be formed in any conventional manner. The multiple gratings could be overlapped spatially using sequential or single exposures depending on the complexity of the technique for example, using a phase mask or could also be fabricated close together typically<3 mm. This allows the gratings to be written as essentially a single multiple-wavelength grating. Thus, the expense to fabricate these gratings is roughly equivalent to that of fabricating a single-wavelength grating. Notably, this approach may also be extended to a number of known fibers or optical components such as single mode, polarization maintaining, or multi-mode fibers or free-space optical elements.

Figure 9:
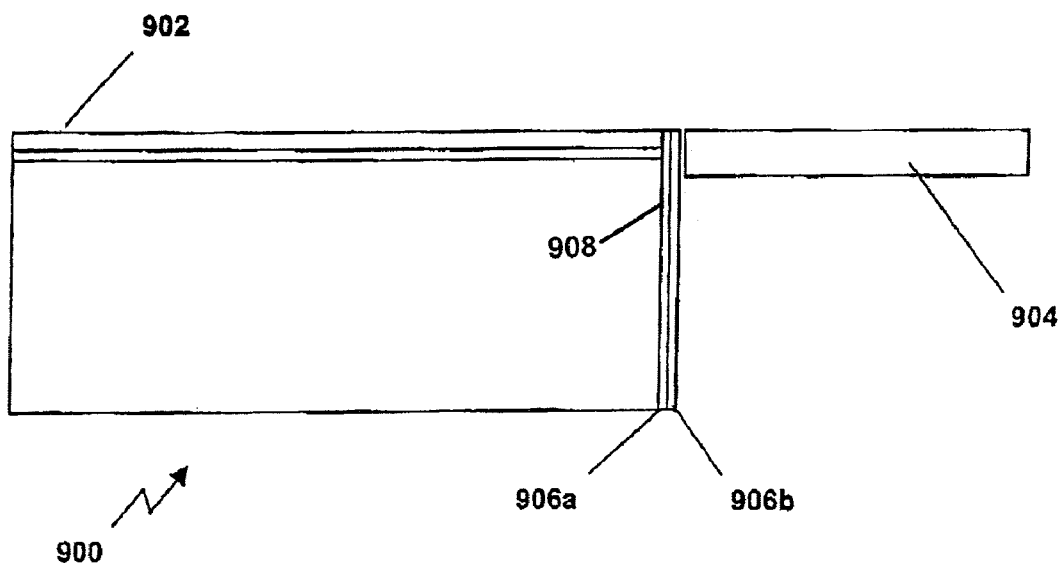
FIG. 9 schematically illustrates an embodiment of a semiconductor laser having multiple feedback reflectors in the form of reflective coatings.

It will be appreciated that other types of reflectors, and not just FBGs, may be used to lock the operating wavelength of the pump laser 400. For example, the coupling fiber may be provided with one or more dielectric coatings on an input or output surface that provide wavelength selective feedback. An example of this is depicted in FIG. 9. A coolerless pump laser 900 includes a semiconductor laser element 902 coupled to transmit its output into a coupling fiber 904. Like the embodiment illustrated in FIG. 4, the laser 900 includes a two frequency selective reflectors 906a and 906b for feeding back light at different wavelengths into the laser element 902. The operation of these reflectors is analogous to that of the grating embodiment. However, in this case, the wavelength-selective reflectors 906a and 906b are dielectric coatings deposited on the output facet 908 of the laser element 902.

A holographic grating having a reflectivity response wherein two predetermined separate wavelengths are reflected at least partially back into the laser cavity providing optical feedback can also be used.

As noted above, the present invention is applicable to fiber amplifier pump lasers and could be utilized with solid-state lasers. While having use in many different applications, it is believed to be particularly useful in applications where the operating requirements of the pump laser are relaxed, for example pumping amplifiers in WDM transmitters and receivers. However, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

In particular, it is fully anticipated that more than two reflectors could be used to establish the overall locking range of the laser. The preferred embodiment described above uses two reflectors at two points of roughly equal absorption level in the absorption wavelength spectrum of a gain medium being pumped. However, more than two reflectors could be used, even though there might be a different level of absorption and/or gain for the different reflector wavelengths. The degree of reflectivity of the different reflectors might also be made different, and could be set to compensate for the different absorption levels faced by the different grating wavelengths. This could allow the feedback contributions at the different reflector wavelengths to be better balanced.

What is claimed is:

1. A laser system, comprising:
   a laser element having a laser signal output, the wavelength profile of which changes with a change in operating conditions;
   a gain medium having an absorption, optically coupled to be pumped by the laser element; and
   a wavelength-selective stabilizing reflective filter in line with the laser for receiving the laser signal, said reflective filter having a reflectivity profile having reflectivity peaks at two predetermined spaced wavelengths, wherein substantially most of the absorption of the gain medium is between or about the peaks of the wavelength selective reflective filter wavelength, the reflective filter being partially reflective at said different predetermined reflective spaced wavelengths and substantially less reflective in a wavelength band there between, and providing optical feedback of a portion of the laser signal to the laser element that wavelength-stabilizes its output, a degree of reflectivity at said predetermined wavelengths and a relative wavelength separation between the predetermined spaced wavelengths being such that throughout the change in operating conditions, output power of the laser element is concentrated at one or more of the reflector center wavelengths, with regions of negligible output power at wavelength sections between the reflector center wavelengths, wherein the laser system is without active cooling.

2. A laser system, as defined in claim 1, wherein a wavelength of the absorption peak of the gain medium is between the two predetermined spaced wavelengths.

3. A laser system, comprising:
   a laser element having a laser signal output, the wavelength profile of which changes with a change in operating conditions, said laser element for pumping a gain medium having an absorption; and
   a wavelength-selective stabilizing reflective filter in line with the laser for receiving the laser signal, said reflective filter having a reflectivity profile having reflectivity peaks at two predetermined spaced wavelengths, wherein substantially most of the absorption of the gain medium is between the peaks of the wavelength selective reflective filter wavelengths, the reflective filter being partially reflective at said different predetermined reflective spaced wavelengths and substantially less reflective in a wavelength band there between, and providing optical feedback of a portion of the laser signal to the laser element that wavelength-stabilizes its output, a degree of reflectivity at said predetermined wavelengths and a relative wavelength separation between the predetermined spaced wavelengths being such that throughout the change in operating conditions, output power of the laser element is concentrated at one or more of the reflector center wavelengths, with regions of negligible output power at wavelength sections between the reflector center wavelengths, wherein the wavelength selective reflective filter includes wavelength selective dielectric coatings.

4. A laser system, comprising:
   a laser element having a laser signal output, the wavelength profile of which changes with a change in operating conditions, said laser element for pumping a gain medium having an absorption in an absorption band; and
   a wavelength-selective stabilizing reflective filter in line with the laser for receiving the laser signal, said reflective filter having a reflectivity profile having reflectivity peaks at two predetermined spaced wavelengths, wherein substantially most of the absorption of the gain medium is between the peaks of the wavelength selective reflective filter wavelength, the reflective filter being partially reflective at said different predetermined reflective spaced wavelengths and substantially less reflective in a wavelength band there between, and providing optical feedback of a portion of the laser signal to the laser element that wavelength-stabilizes its output, a degree of reflectivity at said predetermined wavelengths and a relative wavelength separation between the predetermined spaced wavelengths being such that throughout the change in operating conditions, output power of the laser element is concentrated at one or more of the reflector center wavelengths, with regions of negligible output power at wavelength sections between the reflector center wavelengths, wherein the reflective filter comprises two filters having different reflectivity responses, one of the filters having a reflectivity peak at one of the two predetermined spaced wavelengths and the other of the filters having a reflectivity peak at the other of the two predetermined spaced wavelength and wherein the degree of reflectivity of each of the reflective filters is approximately equal.

5. A laser system, comprising:

a laser element having a laser signal output, the wavelength profile of which changes with a change in operating conditions;

a gain medium having an absorption; and a wavelength-selective stabilizing reflective filter in line with the laser for receiving the laser signal, said reflective filter having a reflectivity profile having reflectivity peaks at two predetermined spaced wavelengths, wherein substantially most of the absorption of the gain medium is between or about the peaks of the wavelength selective reflective filter wavelength, the reflective filter being partially reflective at said different predetermined reflective spaced wavelengths and substantially less reflective in a wavelength band there between, and providing optical feedback of a portion of the laser signal to the laser element that wavelength-stabilizes its output, a degree of reflectivity at said predetermined wavelengths and a relative wavelength separation between the predetermined spaced wavelengths being such that throughout the change in operating conditions, output power of the laser element is concentrated at one or more of the reflector center wavelengths, with regions of negligible output power at wavelength sections between the reflector center wavelengths; and comprising a gain medium optically coupled with the laser element for receiving pump energy therefrom and further comprising an optical isolator in an optical path with the gain medium.

* * * * *